United States Patent
Yamanaka et al.

(10) Patent No.: US 9,780,055 B2
(45) Date of Patent: Oct. 3, 2017

(54) LEAD-FREE SOLDER BALL

(75) Inventors: Yoshie Yamanaka, Tokyo (JP); Ken Tachibana, Tokyo (JP); Shunsaku Yoshikawa, Tokyo (JP); Hikaru Nomura, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/409,412

(22) PCT Filed: Jun. 30, 2012

(86) PCT No.: PCT/JP2012/066822
§ 371 (c)(1),
(2), (4) Date: Mar. 30, 2015

(87) PCT Pub. No.: WO2014/002283
PCT Pub. Date: Jan. 3, 2014

(65) Prior Publication Data
US 2015/0221606 A1 Aug. 6, 2015

(51) Int. Cl.
*H01L 23/00* (2006.01)
*B23K 35/26* (2006.01)
(Continued)

(52) U.S. Cl.
CPC .......... *H01L 24/13* (2013.01); *B23K 1/0016* (2013.01); *B23K 35/0222* (2013.01);
(Continued)

(58) Field of Classification Search
CPC ....... H01L 2924/01322; H01L 2924/00; H01L 2224/1301; H01L 2224/13147;
(Continued)

(56) References Cited

U.S. PATENT DOCUMENTS 5,837,191 A  11/1998  Gickler
6,187,114 B1  2/2001  Ogashiwa et al.
(Continued)

FOREIGN PATENT DOCUMENTS

CN  1369351 A  9/2002
CN  1569383 A  1/2005
(Continued)

*Primary Examiner* — Kiley Stoner
*Assistant Examiner* — Carlos Gamino
(74) *Attorney, Agent, or Firm* — The Webb Law Firm

(57) ABSTRACT

A lead-free solder ball is provided which suppresses interfacial peeling in a bonding interface of a solder ball, fusion defects which develop between the solder ball and solder paste, and which can be used both with Ni electrodes plated with Au or the like and Cu electrodes having a water-soluble preflux applied atop Cu. The lead-free solder ball for electrodes of BGAs or CSPs consists of 1.6-2.9 mass % of Ag, 0.7-0.8 mass % of Cu, 0.05-0.08 mass % of Ni, and a remainder of Sn. It has excellent resistance to thermal fatigue and to drop impacts regardless of the type of electrodes of a printed circuit board to which it is bonded, which are Cu electrodes or Ni electrodes having Au plating or Au/Pd plating as surface treatment. The composition may include at least one element selected from Fe, Co, and Pt in a total amount of 0.003-0.1 mass % or at least one element selected from Bi, In, Sb, P, and Ge in a total amount of 0.003-0.1 mass %.

11 Claims, 2 Drawing Sheets

(51) Int. Cl.
| | |
|---|---|
| *C22C 13/00* | (2006.01) |
| *C22C 13/02* | (2006.01) |
| *H05K 3/34* | (2006.01) |
| *B23K 35/02* | (2006.01) |
| *B23K 1/00* | (2006.01) |
| *H01B 1/02* | (2006.01) |

(52) U.S. Cl.
CPC .......... *B23K 35/0261* (2013.01); *B23K 35/26* (2013.01); *B23K 35/262* (2013.01); *C22C 13/00* (2013.01); *C22C 13/02* (2013.01); *H01B 1/02* (2013.01); *H01L 24/11* (2013.01); *H05K 3/3457* (2013.01); *H01L 2224/1301* (2013.01); *H01L 2224/13147* (2013.01); *H01L 2924/014* (2013.01); *H01L 2924/0105* (2013.01); *H01L 2924/01015* (2013.01); *H01L 2924/01026* (2013.01); *H01L 2924/01027* (2013.01); *H01L 2924/01028* (2013.01); *H01L 2924/01032* (2013.01); *H01L 2924/01047* (2013.01); *H01L 2924/01049* (2013.01); *H01L 2924/01051* (2013.01); *H01L 2924/01078* (2013.01); *H01L 2924/01083* (2013.01); *H01L 2924/01322* (2013.01); *H01L 2924/15311* (2013.01); *H01L 2924/15321* (2013.01); *H01L 2924/15331* (2013.01); *H01L 2924/181* (2013.01); *H01L 2924/2076* (2013.01); *H05K 2203/041* (2013.01)

(58) Field of Classification Search
CPC ..................... H01L 24/11; H01L 24/13; H01L 2924/01015; H01L 2924/01026; H01L 2924/01027; H01L 2924/01028; H01L 2924/01032; H01L 2924/01047
USPC .................................................. 420/560, 561
See application file for complete search history.

(56) References Cited

U.S. PATENT DOCUMENTS

| | | | |
|---|---|---|---|
| 6,689,488 | B2 | 2/2004 | Yoshitome et al. |
| 8,562,906 | B2 | 10/2013 | Tanaka et al. |
| 8,691,143 | B2 | 4/2014 | Ohnishi et al. |
| 2001/0050181 | A1 | 12/2001 | Miura et al. |
| 2002/0117539 | A1 | 8/2002 | Ito et al. |
| 2002/0159913 | A1 | 10/2002 | Ito et al. |
| 2009/0129970 | A1* | 5/2009 | Sung .................... B23K 35/262 420/560 |
| 2009/0301760 | A1 | 12/2009 | Shimamura et al. |
| 2009/0304545 | A1* | 12/2009 | Tanaka .................... B23K 35/26 420/561 |
| 2010/0189594 | A1 | 7/2010 | Fujiyoshi et al. |

FOREIGN PATENT DOCUMENTS

| | | |
|---|---|---|
| CN | 101048258 A | 10/2007 |
| JP | 10118783 A | 5/1998 |
| JP | 2000288772 A | 10/2000 |
| JP | 200196394 A | 4/2001 |
| JP | 200276605 A | 3/2002 |
| JP | 2002239780 A | 8/2002 |
| JP | 2002246742 A | 8/2002 |
| JP | 2003290974 A | 10/2003 |
| JP | 2007237252 A | 9/2007 |
| JP | 2008518791 A | 6/2008 |
| TW | 200740549 | 11/2007 |
| WO | 2006129713 A1 | 12/2006 |
| WO | 2006134891 A1 | 12/2006 |
| WO | 2007081006 A1 | 7/2007 |
| WO | 2007102588 A1 | 9/2007 |
| WO | 2007102589 A1 | 9/2007 |

\* cited by examiner

FIGURE 1 (Background of the Invention)
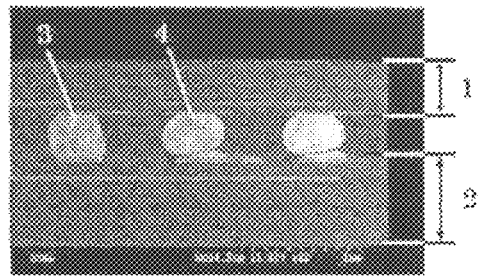
FIGURE 2 (Background of the Invention)
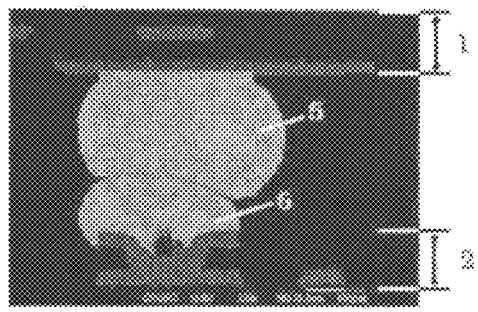
FIGURE 3 (Background of the Invention)
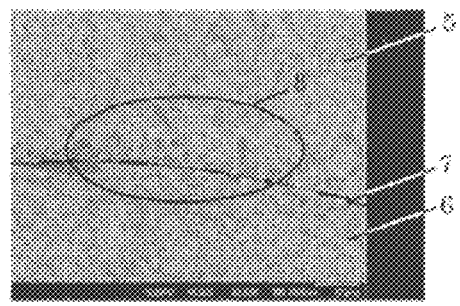
FIGURE 4

LEAD-FREE SOLDER BALL

CROSS-REFERENCE TO RELATED APPLICATION

This application is the United States national phase of International Application No. PCT/JP2012/066822 filed Jun. 30, 2012 the disclosure of which is hereby incorporated in its entirety by reference.

TECHNICAL FIELD

This invention relates to a lead-free solder ball used for electrodes of electronic parts such as semiconductors.

In particular, it relates to a lead-free solder ball which has few problems due to fusion defects.

BACKGROUND ART

Recently, due to decreases in the size of electronic equipment and increases in the speed of electrical signals, electronic parts used in electronic equipment are becoming smaller in size and multifunctional. Examples of electronic parts which have become smaller in size and multifunctional are BGAs (ball grid arrays), CSPs (chip size packages), and MCMs (multichip modules) (collectively referred to below as BGAs). BGAs have electrodes disposed in a lattice-like pattern on the rear surface of a BGA substrate.

In order to mount a BGA on a printed circuit board, electrodes of the BGA and lands of the printed circuit board are connected with each other by solder. However, supplying solder to each electrode and carrying out soldering requires a great deal of effort, and solder cannot be supplied from the exterior to electrodes located at the center of a substrate. Therefore, a method is used in which solder is previously mounded up on the electrodes of a BGA. This method is referred to as solder bump formation.

Solder balls, solder paste, and the like are used for solder bump formation on BGAs. When forming solder bumps with solder balls, a sticky flux is applied to the electrodes of a BGA, and solder balls are placed on the electrodes to which the flux was applied. The BGA substrate is then heated by a heating apparatus such as a reflow furnace to melt the solder balls and form solder bumps on the electrodes. Substrates for semiconductors such as BGA substrates will be collectively referred to as module substrates.

When forming solder bumps on the lands of a wafer using a solder paste, a metal mask having holes which are bored in locations matching the lands of the wafer and which have about the same size as the lands is placed on the wafer, a solder paste is spread atop the metal mask with a squeegee so that solder paste is applied to the lands of the wafer by printing. The wafer is then heated in a reflow furnace to melt the solder paste and form solder bumps.

With conventional BGAs, solder balls made of a Sn—Pb alloy were used for solder bump formation. Sn—Pb solder balls not only have excellent solderability with respect to the electrodes of a BGA but particularly a Sn—Pb eutectic composition has a melting point which does not have thermal effects on BGAs or printed circuit boards at the time of soldering. Moreover, the solder balls contain soft Pb, impacts are absorbed when electronic parts or electronic equipment using these solder balls is dropped, and this fact greatly contributes to increasing the lifespan of electronic parts and electronic equipment. The use of Pb is now being regulated on a global scale, and a Sn—Pb eutectic composition which has conventionally been used for soldering is also being regulated.

Sn—Ag—Cu based solder alloys such as Sn-3.0Ag-0.5Cu and Sn-4.0Ag-0.5Cu have been used as compositions of lead-free solder balls for BGAs. These lead-free solder alloys have excellent resistance to thermal fatigue, but when portable electronic equipment using solder balls having these solder alloy compositions is dropped, interfacial peeling in which peeling takes place from the bonding interface of the solder balls easily occurs, so resistance to drop impacts is inferior. In order to improve resistance to drop impacts, Sn—Ag—Cu—Ni based solder alloys containing Ni have been developed.

However, these Sn—Ag—Cu or Sn—Ag—Cu—Ni based solder compositions used in solder balls have poor wettability compared to conventional Sn—Pb based solders, and when BGAs are mounted on a printed circuit board using solder paste, solder components of the melted solder balls and solder components of the solder paste do not completely commingle with each other, resulting in the problem of the occurrence of the phenomenon of fusion defects in which a layer of an oxide film of Sn develops between the solder balls and the solder paste. FIG. 1 shows an example of bonding of a BGA to a printed circuit board as an example of the phenomenon of fusion defects. Among solder bumps connecting a BGA part 1 and a mounting substrate 2, solder bump 3 was fused, but a fusion defect developed in solder bump 4. FIG. 2 shows a solder bump formed from a solder ball 5 and a solder paste 6 which experienced a fusion defect after heating for mounting. As can be ascertained from FIG. 3, which is an enlargement of FIG. 2, there is only contact at joint 7, which developed a fusion defect. Therefore, if an external impact is applied, the junction easily fractures. If a fusion defect develops, failure easily takes place when an external impact is applied, such as when electronic equipment on which BGAs are mounted is dropped.

In order to prevent problems due to fusion defects, manufacturers of electronic equipment previously inspect joints which have developed fusion defects by a method such as measuring the resistance of electronic equipment, and printed circuit boards which developed fusion defects are repaired or replaced to obviate malfunctions.

The present applicant disclosed a method of applying a post-flux to electrodes of a module such as a BGA as a method of preventing fusion defects which develop when connecting a module such as a BGA and a printed circuit board (WO 2006/134891 A: Patent Document 1).

Compositions for Sn—Ag—Cu—Ni based solder balls for BGAs and the like which have been disclosed include a lead-free solder alloy comprising (1) Ag: 0.8-2.0%, (2) Cu: 0.05-0.3%, and (3) at least one element selected from In: at least 0.01% and less than 0.1%, Ni: 0.01-0.04%, Co: 0.01-0.05%, and Pt: 0.01-0.1%, and a remainder of Sn (WO 2006/129713 A: Patent Document 2), a lead-free solder alloy characterized by comprising Ag: 1.0-2.0 mass %, Cu: 0.3-1.5 mass %, and a remainder of Sn and unavoidable impurities, and a lead-free solder alloy further containing at least one of Sb: 0.005-1.5 mass %, Zn: 0.05-1.5 mass %, Ni: 0.05-1.5 mass %, and Fe: 0.005-0.5 mass %, with the total content of Sb, Zn, Ni, and Fe being at most 1.5 mass % (JP 2002-239780 A: Patent Document 3), a lead-free solder alloy comprising, in mass %, 0.1-1.5% of Ag, 0.5-0.75% of Cu, Ni in an amount satisfying the relationship 12.5≤Cu/Ni≤100, and a remainder of Sn and unavoidable impurities (WO 2007/081006 A: Patent Document 4), and a lead-free solder alloy comprising Ag: 1.0-2.0 mass %, Cu: 0.3-1.0 mass %, Ni: 0.005-0.10 mass %, and a remainder of Sn and unavoidable impurities (WO 2007/102588 A: Patent Document 5).

PRIOR ART DOCUMENTS

Patent Documents

Patent Document 1: WO 2006/134891 A
Patent Document 2: WO 2006/129713 A
Patent Document 3: JP 2002-239780 A
Patent Document 4: WO 2007/081006 A
Patent Document 5: WO 2007/102588 A

SUMMARY OF THE INVENTION

Problem which the Invention is to Solve

When performing mounting of a BGA or the like, it is typical to use a process in which a solder paste comprising a solder alloy powder such as an Sn—Ag—Cu alloy powder and a flux is printed on a mounting substrate, an electronic part such as a BGA having Sn—Ag—Cu based solder alloy bumps formed thereon is placed on the substrate, and heating and melting are carried out to perform soldering. Recently, in this process, even if mounting is carried out at a temperature sufficiently higher than the melting point of the solder alloy, the problem of fusion defects in which solder bumps on a module substrate of a BGA or the like do not fuse with solder paste or electronic parts having leads do not fuse with solder paste, thereby causing conduction defects, is becoming a problem. Fusion defects of course lead to conduction defects and are associated with electronic equipment being unable to perform its function. In some cases, there is the possibility of the fusion defects resulting in claims for compensation against the manufacturer. Soldering of a module to a printed circuit board is different from soldering of a printed circuit board and a chip part which has little warping. It is characterized in that both the module and the printed circuit board undergo a large amount of warping due to heating for reflow. This phenomenon was recognized before electrodes of electronic parts became lead free, but its occurrence is being more frequently observed as electrodes of electronic parts become lead free, and there is an urgent need to develop a countermeasure with respect to electrodes made of lead-free solder which are becoming mainstream.

The main causes of fusion defects are the effect of corrosion of solder bump surfaces of modules such as BGAs and warping of substrates and electronic parts. In particular, a strong oxide film develops on a solder bump surface which is inadequately cleaned of flux used at the time of bump formation or when an electronic part has been exposed to a high temperature and a high humidity. The role of cleaning off this surface oxide film is normally performed by the flux contained in solder paste which is printed on a printed circuit board during a surface mounting process. However, when the above-described surface oxide film is strong, its surface is not easily reduced. In addition, when a substrate or electronic part develops warping due to heating at the time of mounting, the solder paste which was applied by printing may separate from solder bumps on the electronic part. As a result, the possibility of the occurrence of fusion defects is increased. According to reports on the market, the percent of occurrence of fusion defects is on the ppm level, but in experimental exposure of solder balls to a high temperature, high humidity environment which causes corrosion of the surface of the solder balls, it has been ascertained that the percent of occurrence of fusion defects rises to 50-70%.

The present inventors have now found that in addition to the above-described causes, the formation of compounds inside the solder due to the composition of solder balls, namely, Cu6Sn5 or (Cu,Ni)6Sn5 is a cause of fusion defects. When electronic parts having solder balls connected thereto are mounted on a mounting substrate on which a solder paste was printed, mounting is carried out with the electrode side of a module such as a BGA to which solder balls are connected facing downwards with respect to the mounting substrate. Heating is then carried out to melt the solder paste and the solder balls leading to fusion. However, when a large amount of the compound $Cu_6Sn_5$ or $(Cu,Ni)_6Sn_5$ is formed inside a solder ball, the compound sediments inside the solder ball at the time of melting of the solder ball, and the phenomenon in which the compound precipitates in the vicinity of the outermost surface of the resulting bump occurs. It was found that this phenomenon inhibits fusion of the solder ball with solder paste and becomes a main cause of the occurrence of fusion defects (FIG. 3).

Conceivable countermeasures against fusion defects are eliminating warping which develops in electronic parts or mounting substrates or increasing the activity of solder paste. However, with current technology, it is impossible from a practical standpoint to eliminate warping of substrates. In addition, increasing the activity of a flux in solder paste promotes a reaction with solder powder, so from the standpoint of changes over time, this countermeasure is difficult because it may decrease the reliability of paste. Accordingly, there was no effective countermeasure against fusion defects. Therefore, it was typical to solve the problem of fusion defects by a method like that of Patent Document 1 even though it increased the number of steps and was associated with cost increases.

The problem to be solved by the present invention is to find a method of overcoming fusion defects based only on the composition of a solder ball without employing methods which increase the number of steps as in Patent Document 1.

Means for Solving the Problem

The present inventors found that fusion defects are caused by Ni which is added to improve the resistance to drop impacts of solder balls. Ni forms intermetallic compounds with Sn and Cu, and the resulting intermetallic compounds precipitate on the solder ball surface and prevent the solder components of solder balls and the solder components in solder paste from commingling with each other. In addition, the wettability of solder balls affects fusion defects with solder paste, and a decrease in wettability accompanying a decrease in the Ag content is also a cause of fusion defects.

It was found that by setting the contents of Sn, Cu, and Ni so as to be in prescribed ranges in a quaternary alloy containing Ni in Sn—Ag—Cu, the amount of intermetallic compounds of Sn, Cu, and Ni which are formed is suppressed, resulting in a decrease of the amount of compounds precipitating on the solder ball surface, and sufficient wettability for fusion with solder paste is exhibited, thereby making it possible to dramatically decrease fusion defects. As a result, the present invention was completed.

The present invention is a lead-free solder ball which is mounted on a module substrate of a BGA or a CSP and is used as an electrode, the solder ball having a composition consisting essentially of 1.6-2.9 mass % of Ag, 0.7-0.8 mass % of Cu, 0.05-0.08 mass % of Ni, and a remainder of Sn.

In order to improve the thermal fatigue properties of a solder ball, intermetallic compounds of Sn and Ag, of Sn, Cu, and Ni, and the like are formed by adding Ag, Cu, and Ni to solder. As a result, a strong solder alloy is formed due to the intermetallic compounds forming a mesh-like network. In order to increase resistance to drop impacts, a method like that disclosed in Patent Document 4 in which Ni is added instead of decreasing the content of hard Ag is employed. However, Ni which is added in order to increase strength easily forms compounds due to the liability of Ni to easily form intermetallic compounds with Cu, and the resulting compounds precipitate on the surface of a solder ball and worsen the wettability of the solder ball. Portions of poor wettability which develop on the surface of a solder ball are not compatible with solder paste during the heating period for reflow when the solder ball is mounted on a printed circuit board and heated with solder paste, and these portions may solidify with boundary lines appearing. This is the phenomenon of fusion defects.

In order to decrease the amount of Ni compounds which precipitate on the surface of a solder ball made of a solder alloy having a Sn—Ag—Cu—Ni composition, the present inventors focused on the fact that intermetallic compounds of Sn, Cu, and Ni do not precipitate on a solder ball surface if the content of Cu which reacts with Ni is decreased. However, if the Cu content is decreased, resistance to drop impacts decreases when soldering to Cu electrodes is carried out. The present inventors found that by setting the content of Cu which is added to a solder alloy in the vicinity of 0.75 mass % which is near the eutectic point, consumption of Cu due to network formation and consumption of Cu due to the formation of compounds of Cu and Ni are balanced, and compounds of Cu and Ni no longer precipitate in a large amount on the solder ball surface, thereby preventing fusion defects from developing.

Namely, by making a solder ball composition a quaternary alloy composition containing 1.6-2.9 mass % of Ag, 0.7-0.8 mass % of Cu, and 0.05-0.08 mass % of Ni, a network of Sn—Ag—Cu intermetallic compounds is formed, and the formation of Cu—Ni intermetallic compounds occurs by reaction of Cu, which is reduced in amount by the formation of the network, with Ni. Therefore, Cu does not preferentially react with Ni, and precipitation of intermetallic compounds of Cu and Ni on the solder ball surface is prevented. As a result, when the solder ball is soldered to a printed circuit board with solder paste, the solder ball exhibits good wettability and fusion defects do not develop.

Effects of the Invention

With a solder ball according to the present invention, intermetallic compounds of Sn, Cu, and Ni which have poor wettability do not precipitate on the solder ball surface, so good soldering is possible, and when the solder ball is soldered to a printed circuit board using a solder paste, good solderability can be achieved without the occurrence of fusion defects.

In addition, a solder ball according to the present invention can achieve good solder connections between an electrode of a BGA or the like and a printed circuit board whether it is soldered to a Cu electrode or an Ni electrode while providing excellent resistance to thermal fatigue and resistance to drop impacts.

BRIEF EXPLANATION OF THE DRAWINGS

FIG. 1 is an example of connection between a BGA and a printed circuit board.

FIG. 2 is an enlarged view of 4 in FIG. 1.

FIG. 3 is a figure showing the occurrence of fusion defects in the bonding interface between the solder ball of FIG. 2 and solder paste.

FIG. 4 is a figure showing an electrode of a BGA of Example 2 in Table

MODES FOR CARRYING OUT THE INVENTION

Figure 5:
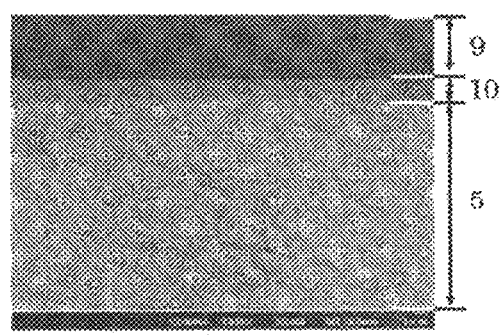
FIG. 5 is a figure showing an electrode of a BGA of Comparative Example 6 of Table 1.

A solder ball according to the present invention which does not develop fusion defects and which has both excellent resistance to thermal fatigue and excellent resistance to drop impacts is preferably used for bump formation on a package part such as a BGA having electrodes on its lower surface.

If the Ag content of a Sn—Ag—Cu—Ni based solder alloy of a solder ball according to the present invention is less than 1.6 mass %, the wettability of the solder ball decreases. As a result, wettability to solder paste decreases and fusibility worsens, and fusion defects easily occur. In addition, if the Ag content is less than 1.6 mass %, the strength of solder decreases and resistance to thermal fatigue worsens. If the Ag content exceeds 2.9 mass %, the solder ball become hard and resistance to drop impacts worsens. Accordingly, an alloy for a solder ball according to the present invention preferably has an Ag content of 1.6-2.9 mass %. More preferably it is 1.9-2.3 mass %.

If the Cu content of a Sn—Ag—Cu—Ni based solder alloy of a solder ball according to the present invention is less than 0.7 mass %, the composition moves away from the eutectic point of Sn—Ag—Cu, so when the solder ball is used with a Cu electrode, Cu from the Cu electrode diffuses into the solder. As a result, a Cu6Sn5 intermetallic compound layer becomes thick at the interface with the Cu electrode, and resistance to drop impacts worsens.

If the Cu content of a Sn—Ag—Cu—Ni based solder alloy exceeds 0.8 mass %, the amount of intermetallic compounds of Cu and Ni in the solder ball increases so that intermetallic compounds of Cu and Ni precipitate on the surface of the solder balls, thereby increasing the occurrence of fusion defects. In addition, if the Cu content exceeds 0.8 mass %, the composition moves away from the eutectic point of Sn—Ag—Cu, so the Cu6Sn5 intermetallic compound easily forms in a reaction layer between the solder alloy and a Cu electrode. As a result, the Cu6Sn5 intermetallic compound which is formed in the solder bonding interface with the Cu electrode becomes thick.

Accordingly, the Cu content of a Sn—Ag—Cu—Ni based solder alloy of a solder ball according to the present invention which does not develop fusion defects and which has excellent resistance to drop impacts must be 0.7-0.8 mass %.

If the Ni content of a Sn—Ag—Cu—Ni based solder alloy of a solder ball according to the present invention is less than 0.05 mass %, resistance to drop impacts worsens. In addition, if the Ni content is less than 0.05 mass %, the effect of adding Ni is not obtained. Thus, Ni easily diffuses from a Ni electrode, and it becomes easy for intermetallic compounds to form in the interface. Therefore, the content of Ni in a Sn—Ag—Cu—Ni based solder alloy must be at least 0.05 mass %.

Similarly, if the Ni content exceeds 0.08 mass %, the amount of intermetallic compounds of Sn, Cu, and Ni in the solder ball increase so that intermetallic compounds of Sn, Cu, and Ni precipitate on the solder ball surface, and the occurrence of fusion defects increases. Furthermore, if the Ni content exceeds 0.08 mass %, the Ni concentration in intermetallic compounds formed in the bonding interface increases leading to a decrease in the bonding strength, and the hardness of solder increases. As a result, peeling at the interface more easily occurs when an impact is applied.

Therefore, the Ni content in a Sn—Ag—Cu—Ni based solder alloy for a solder ball according to the present invention must be 0.05-0.08 mass %.

At least one element selected from Fe, Co, and Pt in a total amount of 0.003-0.1 mass % may be further added to a Sn—Ag—Cu—Ni based solder alloy for a solder ball according to the present invention. Addition of the elements Fe, Co, or Pt to an alloy for a solder ball refines an intermetallic compound layer which is formed at the bonding interface and suppresses its thickness, so it has the effect of improving dropping resistance. If the content of elements selected from Fe, Co, and Pt is less than 0.03 mass %, the above-described effect is extremely difficult to obtain, while if they are added in excess of 0.1 mass %, the hardness of solder bumps increases and there is the harmful effect that interfacial peeling due to impacts develops.

At least one element selected from Bi, In, Sb, P, and Ge in a total amount of 0.003-0.1 mass % may be further added to a Sn—Ag—Cu—Ni based solder alloy for a solder ball according to the present invention. After a solder ball is mounted on a module substrate, it is determined by image recognition whether soldering has taken place. If discoloration of a solder ball such as yellowing occurs, image recognition may determine that a defect is present. Therefore, it is preferable that a solder ball not undergo discoloration during reflow. The addition of Bi, In, Sb, P, or Ge has the effect of preventing discoloration due to heat or the like, whereby errors in quality inspection of bumps can be avoided. If the content of elements selected from Bi, In, Sb, P, and Ge is less than 0.003 mass %, it is extremely difficult to obtain the above-described effect, while if they are added in excess of 0.1 mass %, the hardness of solder bumps increases, and there is a possibility of a decrease in the effect of improving dropping resistance.

A solder ball according to the present invention is used for electrodes. The diameter of the solder ball is at least 0.1 mm, preferably at least 0.3 mm, and more preferably at least 0.5 mm. In recent years, electronic equipment is becoming increasingly miniaturized, and solder balls mounted on electronic parts continue to become smaller. Solder balls for bonding of flip chips are typically 0.1 mm or smaller, while solder balls like the solder ball of the present invention which are used for electrodes of BGAs and CSPs which have a flip chip housed therein are primarily at least 0.1 mm in size.

EXAMPLES

Solder alloys having the compositions shown in Table 1 were prepared, and they were formed into solder balls having a diameter of 0.3 mm by the gas atomization method. The resulting solder balls were used to evaluate with respect to fusion defects and by a thermal fatigue test and a drop impact test.

TABLE 1

| | | Solder composition (mass %) | | | | | | | | | | | Number of fusion defects | Number of cycles in thermal fatigue test | Number of drops in drop impact test | Remarks |
|---|---|---|---|---|---|---|---|---|---|---|---|---|---|---|---|---|
| | | Sn | Ag | Cu | Ni | Fe | Co | Pt | Bi | In | Sb | P | Ge | | | | |
| Examples | 1 | Rem | 1.6 | 0.75 | 0.07 | | | | | | | | | 0 | 1623 | 141 | |
| | 2 | Rem | 2.0 | 0.75 | 0.07 | | | | | | | | | 0 | 1900 | 118 | |
| | 3 | Rem | 2.5 | 0.75 | 0.07 | | | | | | | | | 0 | 1971 | 91 | |
| | 4 | Rem | 2.9 | 0.75 | 0.07 | | | | | | | | | 0 | 2373 | 66 | |
| | 5 | Rem | 1.8 | 0.70 | 0.05 | | | | | | | | | 0 | 1696 | 133 | |
| | 6 | Rem | 2.9 | 0.80 | 0.08 | | | | | | | | | 0 | 2296 | 57 | |
| | 7 | Rem | 2.5 | 0.70 | 0.08 | | | | | | | | | 0 | 2008 | 88 | |
| | 8 | Rem | 2.5 | 0.80 | 0.05 | | | | | | | | | 0 | 2181 | 82 | |
| | 9 | Rem | 2.0 | 0.75 | 0.07 | 0.01 | | | | | | | | 0 | 1915 | 135 | |
| | 10 | Rem | 2.0 | 0.75 | 0.07 | | 0.008 | | | | | | | 0 | 1935 | 128 | |
| | 11 | Rem | 2.0 | 0.75 | 0.07 | | | 0.05 | | | | | | 0 | 1903 | 133 | |
| | 12 | Rem | 2.0 | 0.75 | 0.07 | | | | 0.1 | | | | | 0 | 1942 | 115 | |
| | 13 | Rem | 2.0 | 0.75 | 0.07 | | | | | 0.1 | | | | 0 | 1928 | 112 | |
| | 14 | Rem | 2.0 | 0.75 | 0.07 | | | | | | 0.07 | | | 0 | 1930 | 120 | |
| | 15 | Rem | 2.0 | 0.75 | 0.07 | | | | | | | 0.003 | | 0 | 1895 | 117 | |
| | 16 | Rem | 2.0 | 0.75 | 0.07 | | | | | | | | 0.008 | 0 | 1890 | 116 | |
| Comparative examples | 1 | Rem | 3.0 | 0.50 | | | | | | | | | | 0 | 2464 | 1 | |
| | 2 | Rem | 1.0 | 0.50 | | | | | | | | | | 10 | 898 | 1 | |
| | 3 | Rem | 1.0 | 0.75 | 0.07 | | | | | | | | | 15 | 977 | 156 | |
| | 4 | Rem | 3.5 | 0.75 | 0.07 | | | | | | | | | 0 | 2489 | 18 | |
| | 5 | Rem | 2.5 | 0.60 | 0.07 | | | | | | | | | 0 | 1965 | 35 | |
| | 6 | Rem | 2.5 | 0.90 | 0.07 | | | | | | | | | 11 | 1991 | 29 | |
| | 7 | Rem | 2.5 | 0.75 | 0.03 | | | | | | | | | 0 | 1913 | 37 | |
| | 8 | Rem | 2.5 | 0.75 | 1.00 | | | | | | | | | 15 | 2156 | 22 | |
| | 9 | Rem | 1.2 | 0.50 | 0.05 | | | | | | | | | 13 | 1037 | 1 | |
| | 10 | Rem | 2.5 | 0.50 | 0.50 | | | | | | | | | 17 | 1972 | 1 | |
| | 11 | Rem | 3.0 | 1.00 | 0.50 | | | | | | | | | 20 | 2399 | 1 | |
| | 12 | Rem | 1.5 | 0.50 | 0.50 | | | | | | | | | 18 | 1244 | 1 | Pat. Doc. 3 |
| | 13 | Rem | 2.0 | 1.00 | 0.01 | | | | | | | | | 14 | 1890 | 1 | |
| | 14 | Rem | 1.5 | 0.65 | 0.07 | | | | | | | | | 10 | 1102 | 39 | |
| | 15 | Rem | 3.0 | 0.50 | 0.05 | | | | | | | | | 0 | 2406 | 1 | |
| | 16 | Rem | 2.0 | 0.70 | 0.15 | | | | | | | | | 16 | 1876 | 1 | |
| | 17 | Rem | 1.8 | 1.50 | 0.15 | | | | | | | | | 28 | 1650 | 1 | |

1. The number of occurrences of fusion defects was evaluated by the following procedure. Solder balls which were made using each composition were subjected to aging treatment at a temperature of 110° C. and a relative humidity of 85% for 24 hours. A solder paste was printed on a glass epoxy substrate (FR-4) measuring 36×50 mm and having a thickness of 1.2 mm with the electrode pattern of the substrate, and the solder balls which had undergone the aging treatment were mounted on the electrodes and subjected to reflow at a temperature of at least 220° C. for 40 seconds with a peak temperature of 245° C. The number of fusion defects occurring between the solder balls and the solder paste was counted using a stereomicroscope.

2. Next, a thermal fatigue test and a drop impact test were carried out in the following manner. The solder balls of each composition which were made were used to carry out reflow soldering to a module substrate for a CSP measuring 12×12 mm using a WF-6400 flux manufactured by Senju Metal Industry Co., Ltd., thereby fabricating a CSP using each solder composition for electrodes.

3. A solder paste was printed on a glass epoxy substrate (FR-4) measuring 30×120 mm and having a thickness of 0.8 mm with the electrode pattern of the substrate, and the CSP fabricated in Step 2 was mounted on the substrate and subjected to reflow at a temperature of 220° C. or above for 40 seconds with a peak temperature of 245° C. to fabricate a substrate for evaluation.

4. The thermal fatigue test was carried out under the following conditions. Using the substrate for evaluation fabricated in Step 3, the resistance was continuously measured in a series circuit while a thermal load consisting of −40° C. for 10 minutes and +125° C. for 10 minutes was repeatedly applied using a Model TSA-101LA thermal shock chamber manufactured by ESPEC Corporation. It was determined that failure had taken place when the resistance exceeded 15 ohms, and the number of thermal fatigue cycles before the failure was recorded.

5. A drop impact test was carried out under the following conditions using a substrate for evaluation like one used for the thermal fatigue test. The test method comprised securing both ends of the substrate for evaluation at a position 10 mm above a base using a special jig. In accordance with JEDEC specifications, an impact with an acceleration of 1500 G was repeatedly applied. It was determined that failure occurred when the resistance increased to 1.5 times the initial resistance, and the number of drops before the failure was recorded.

In Example 2 in Table 1, the contents of Ag, Cu, and Ni were all in suitable ranges, so the results with respect to fusion defects, thermal fatigue resistance, and drop impact resistance were all excellent. FIG. 4 shows the layer of a compound in the bonding interface in Example 2. It can be seen that a thin $Cu_6Sn_5$ intermetallic compound layer was formed in the bonding portion between a BGA electrode 9 and a solder ball 5.

In the case of the solder ball alloy compositions of Comparative Examples 1, 4, and 11 having an Ag content exceeding 2.9 mass %, although effects of improving resistance to thermal fatigue and fusion defects were exhibited, the Ag content was not optimal in order to obtain drop impact resistance. Thus, the number of drops was less than 20, and a sufficient improvement was not obtained.

For Comparative Examples 2, 3, 9, and 10, the Ag content was less than 1.6 mass %, so they had poor resistance to thermal fatigue and the number of cycles did not reach 1500. Due to a decrease in wettability caused by insufficient Ag content, there were more than 10 fusion defects, and there was no effect of suppressing fusion defects.

In Comparative Examples 5, 6, 7, and 8, although a suitable Ag content was selected, the contents of Cu and Ni were not optimized, so the effects of improving both fusion defects and resistance to drop impacts were not obtained. FIG. 5 shows a layer of compounds in the bonding interface for Comparative Example 6. It can be seen that a thick $Cu_6Sn_5$ intermetallic compound layer was formed.

It can be concluded that a solder composition consisting essentially of 1.6-2.9 mass % of Ag, 0.7-0.8 mass % of Cu, 0.05-0.08 mass % of Ni, and remainder of Sn provides a solder alloy which suppresses the occurrence of fusion defects and which has both resistance to thermal fatigue and resistance to drop impacts.

INDUSTRIAL APPLICABILITY

According to the present invention, a solder ball for electrodes is provided which has the effect of suppressing the occurrence of fusion defects and which has excellent resistance to thermal fatigue as well as excellent resistance to drop impacts when used either with Cu electrodes (Cu—OSP electrodes, i.e., ones which are coated with a water-soluble flux atop Cu) and with Ni electrodes (electrolytic Ni/Au electrodes or electroless Ni/Pd/Au electrodes). Suppressing fusion defects is associated with a decrease in the occurrence of initial failures in a manufacturing process. Until now, it was necessary to select a composition in accordance with the properties demanded of products. However, because a solder ball according to the present invention has resistance to both drop impacts and thermal fatigue, it is possible to apply the solder ball to a wide range of fields from portable devices to personal computers and vehicle mounted equipment and to the new field of mobile personal computers which is rapidly developing.

EXPLANATION OF SYMBOLS

1 BGA part
2 mounting substrate
3 fusion of solder bump
4 fusion defect of solder bump
5 solder ball after heating for mounting
6 solder paste after heating for mounting
7 portion of a fusion defect
8 fusion-impeding compound
9 BGA electrode
10 layer of $Cu_6Sn_5$ intermetallic compound

The invention claimed is:

1. A lead-free solder ball which is installed for use as an electrode on a rear surface of a module substrate for a BGA or a CSP, the solder ball having a solder composition consisting of:
   1.6-2.9 mass % of Ag,
   0.7-0.8 mass % of Cu, 0.05-0.08 mass % of Ni, and
   a remainder of Sn.

2. A lead-free solder ball as set forth in claim 1, wherein the solder composition consists of:
   1.9-2.3 mass % of Ag,
   0.7-0.8 mass % of Cu,
   0.05-0.08 mass % of Ni, and
   a remainder of Sn.

3. A lead-free solder ball as set forth in claim 1, wherein the solder ball has a diameter of at least 0.1 mm.

4. A lead-free solder ball as set forth in claim 1, wherein the solder ball has a diameter of at least 0.3 mm.

5. A lead-free solder ball as set forth in claim 1, wherein the solder ball has a diameter of at least 0.5 mm.

6. A method of forming solder bumps on a module substrate having electrodes selected from electrolytic Ni/Au electrodes, electroless Ni/Pd/Au electrodes, and Cu—OSP electrodes, wherein soldering is performed using a solder ball as set forth in claim 1.

7. A lead-free solder ball as set forth in claim 1, wherein the lead-free solder ball develops zero occurrence of fusion defects in a test for fusion defects.

8. A module substrate for a BGA or a CSP comprising the lead-free solder ball of claim 1.

9. A module substrate for a BGA or a CSP comprising the lead-free solder ball of claim 2.

10. An electronic part comprising a module substrate for a BGA or a CSP mounted on a printed circuit board and the lead-free solder ball of claim 1.

11. An electronic part comprising a module substrate for a BGA or a CSP mounted on a printed circuit board and the lead-free solder ball of claim 2.

* * * * *